(12) United States Patent
Gau

(10) Patent No.: US 6,545,307 B2
(45) Date of Patent: Apr. 8, 2003

(54) STRUCTURE OF A DRAM AND A MANUFACTURING PROCESS THEREFOR

(75) Inventor: Jing-Horng Gau, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/035,276

(22) Filed: Jan. 3, 2002

(65) Prior Publication Data

US 2002/0058386 A1 May 16, 2002

Related U.S. Application Data

(62) Division of application No. 09/767,498, filed on Jan. 23, 2001.

(30) Foreign Application Priority Data

Nov. 9, 2000 (TW) .......................... 89123686 A (51) Int. Cl.⁷ ...................... H01K 31/113; H01K 31/119
(52) U.S. Cl. ........................ 257/296; 257/295; 257/306; 257/311; 257/763
(58) Field of Search ................................. 438/248, 692, 438/238, 253, 381, 672; 257/296, 306, 776, 311, 905, 906, 295, 352, 763

(56) References Cited

U.S. PATENT DOCUMENTS

| | | | | | |
|---|---|---|---|---|---|
| 5,627,095 A | * | 5/1997 | Koh et al. | ................... | 438/672 |
| 5,700,731 A | * | 12/1997 | Lin et al. | .................... | 438/381 |
| 6,080,620 A | * | 6/2000 | Jeng | ............................. | 438/253 |
| 6,218,241 B1 | * | 4/2001 | Chuang | ...................... | 438/253 |
| 6,255,160 B1 | * | 7/2001 | Huang | ......................... | 438/253 |
| 6,373,090 B1 | * | 4/2002 | Chi | ............................. | 257/306 |
| 6,380,576 B1 | * | 4/2002 | Tran | ............................ | 257/296 |
| 6,423,641 B1 | * | 7/2002 | Gau | ............................ | 438/692 |
| 2001/0023097 A1 | * | 9/2001 | Huang | ........................ | 438/238 |
| 2002/0064956 A1 | * | 5/2002 | Wu et al. | .................. | 438/692 |
| 2002/0110979 A1 | * | 8/2002 | Wang | ......................... | 438/248 |

* cited by examiner

*Primary Examiner*—Michael S. Lebentritt
(74) *Attorney, Agent, or Firm*—Charles C. H. Wu; Wu & Cheung, LLP (57) ABSTRACT

A structure of a DRAM and a manufacturing process therefor, suitable for a substrate on which a plurality of word lines and a plurality of source/drain regions on sides of each of these word lines are formed. A plurality of bit line contacts and a plurality of node contacts are formed in electric contact with the source/drain regions. A first patterned insulating layer is formed on the substrate, in which a plurality of openings are formed in the insulating layer to expose the bit line contacts. The substrate is covered with a first conductive layer and a second insulating layer in sequence. The second insulating layer, the first conductive layer and the first insulating layer are patterned in sequence to form a plurality of bit line stacked structures and a plurality of bit lines electrically connecting to the bit contacts, exposing the node contacts. As a result, the bit line stacked structure forms a plurality of trenches and the bit line stacked structure is orthogonal to the word lines. A plurality of spacers are formed on sidewalls of the bit line stacked structure. A plurality of second conductive layers are formed conformal to the surfaces of the trenches. The second conductive layers are patterned to form a plurality of bottom electrodes electrically connected to the node contacts.

8 Claims, 9 Drawing Sheets

STRUCTURE OF A DRAM AND A MANUFACTURING PROCESS THEREFOR

The Divisional of application Ser. No. 09/767,498 filed Jan. 23, 2001.

CROSS-REFERENCE TO RELATED APPLICATION

This application claims the priority benefit of Taiwan application serial no. 89123686, filed Nov. 9. 2000.

BACKGROUND OF THE INVENTION

1. Field of the Invention

The present invention relates to a structure of integrated circuit (IC) and a manufacturing process for the same. More specifically, the present invention relates a structure of a dynamic random access memory (DRAM) and a manufacturing process for the same.

2. Description of the Related Art

A basic structure of a DRAM cell consists of a metal-oxide-semiconductor (MOS) device and a capacitor. A source/drain region of such a MOS device is electrically connected to a bit line. Another source/drain region of the MOS device not connected to the bit line is electrically connected to the capacitor. The data of the DRAM cell is determined by the charge of the capacitor. In current memory cells, which are small in size, a capacitor is provided on the bit line in order to increase the capacitance of the capacitor. Data dislocation and data refreshment for the capacitor are thereby reduced and operational efficiency is increased. This structure is known as a Capacitor on Bit Line (COB), in which the cross-sectional area of the bottom of the capacitor is increased as much as possible, i.e., the surface area of the capacitor is as large as possible. Furthermore, gates of MOS devices in the same row of memory cells line up to form a word line in a direction orthogonal to the bit line.

Here, conventional production of a DRAM includes three stages summarized as follows:

(1) After the MOS transistors for the memory cell are completed, the substrate is covered with a first insulating layer. A bit line contact in electric contact with the source region is formed in the first insulating layer. A bit line in electric contact with a bit line contact is formed on the first insulating layer.

(2) The substrate is covered with a second insulating layer. A node contact opening is formed in the second and first insulating layers. Such node contact opening penetrates through the second insulating layer between two adjacent bit lines to expose the drain region. Subsequently, the node contact opening is filled with a conductive material to form a node contact.

(3) A conductive layer is formed on the substrate. The conductive layer is patterned by using a photo mask having an irregular pattern to form an irregular bottom electrode. The bottom electrode is in electric contact with the node contact.

However, there are some disadvantages in the conventional production of a capacitor, summarized as follows: First, in stage (2), when the node contact opening is formed in the second and first insulating layers, a self-aligned process cannot be used because of the existing bit line, resulting in a misalignment of the node contact (opening) and the drain region.

Second, in stage (2), the node contact opening exposes the bit line to create a short between the node contact and the bit line formed later.

Third, in stage (3), since the definition of the bottom electrode is not carried out in a self-aligned process, it is not easy to align the bottom electrode with the node contact.

Fourth, in stage (3), since the bottom electrodes having different memory cells have to be separated from each other, the irregular photo mask used for the bottom electrode is required. Therefore, the production of the photomask is complicated and expensive.

These disadvantages result in reduced yield of the product. In addition, another disadvantage is further present in that the resistance of the bit line may be decreased to slow down the operation of the devices, explained briefly as follows. With decreased linewidth in the current semiconductor process, one way to decrease the resistance of leads so as to increase the operational speed for the devices is to use a low-resistance material. Another is to increase the thickness of the leads so as to increase the cross-sectional area. However, in stage (1) of the conventional process of a DRAM, the resistance of the bit line can be decreased by increasing the thickness of the bit line. This is because the node contact opening is etched from top of the second insulating layer exceeding the bit line until the drain region under the first insulating layer of the bit line is exposed. Therefore, the depth of the node contact opening is very large. In addition, the width of the node contact opening decreases as device integration increases, resulting in a larger aspect ratio for etching. Therefore, etching tends to be incomplete and the electric connection of the node contact (bottom electrode) to the drain electrode is imperfect. Accordingly, the thickness of the bit line in the conventional process of a DRAM cannot be increased sufficiently to prevent the aspect ratio of the node contact opening for etching from being increased. In other words, the cross-sectional area of the bit line cannot be increased, and thus the resistance thereof cannot be decreased.

SUMMARY OF INVENTION

The invention provides a process for fabricating a DRAM, suitable for a substrate on which a plurality of word lines and a plurality of source/drain regions on sides of each of these word lines are formed. In the invention, a plurality of bit line contacts and a plurality of node contacts are formed in electric contact with the source/drain regions. A first patterned insulating layer is formed on the substrate. A plurality of openings is formed in the insulating layer to expose the bit line contacts. The substrate is covered by a first conductive layer and a second insulating layer in sequence. The second insulating layer, the first conductive layer and the first insulating layer are patterned in sequence to form a plurality of bit line stacked structures and a plurality of bit lines electrically connecting to the bit contacts. The node contacts are exposed. The bit line stacked structure forms a plurality of trenches and the bit line stacked structure is orthogonal to the word lines. A plurality of spacers is formed on the sidewalls of the bit line stacked structure. A plurality of second conductive layers is formed conformal to the surfaces of the trenches. Finally, the second conductive layers are patterned to form a plurality of bottom electrodes electrically connected to the node contacts.

The invention also provides a structure for a DRAM, comprising a plurality of word lines, a plurality of source/drain regions, a first insulating layer, a plurality of bit line contact and node contact, a plurality of bit line stacked structure, a plurality of spacers, and a plurality of bottom electrode. In the structure according to the present invention, the word line is located on the substrate. The source/drain region is located at the sides of each of the word lines. The first insulating layer is disposed on the word lines and substrate. The bit line contact and the node contact are located in the first insulating layer and are electrically connected to the source/drain region. The bit line stacked structure is located on the first insulating layer and the bit line contact. These bit line stacked structures are orthogonal to the word lines, and each of the bit line stacked structures is built up by stacking a second insulating layer, a bit line and a third insulating layer from bottom to top, with the bit lines passing through the second insulating layer and electrically connecting to the bit line contacts. The spacers are located on the sidewalls of each of the bit line stacked structures. The trench is formed between each two spacers. The bottom electrode is located on the surface of the trench. Each bottom electrode is electrically connected to one of the node contacts.

As mentioned above, in the process for fabricating DRAM of the present invention, a patterning board for the bottom is formed to expose the node contact while the bit line (stacked structure) is defined. Moreover, a second insulating layer and spacers are provided on the bit line and sides thereof as electric insulation, respectively. As a result, a short circuit does not occur between the bit line and the bottom electrode. A self-aligned process can be used for the bit line and the capacitor.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Reference will now be made in detail to the present preferred embodiments of the invention, examples of which are illustrated in the accompanying drawings. Whenever possible, the same reference numbers are used in the drawings and the description to refer to the same or like parts.

Figure 1:
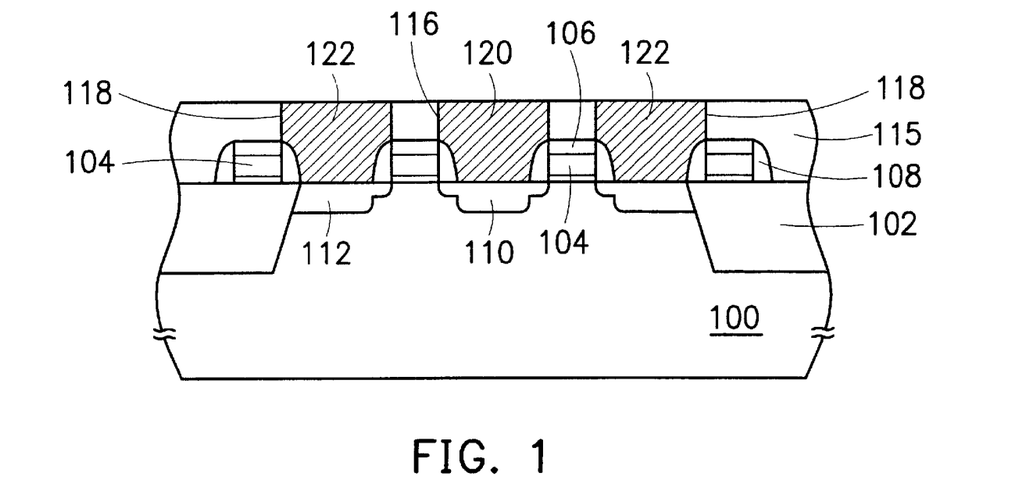
FIGS. 1–8 are schematic cross-sectional views of a production process of a DRAM according to a preferred example of the present invention, in which cross sections of FIGS. 1, 2, 3 and 7 are orthogonal to those of FIGS. 4, 5, 6 and 8.

Referring to FIG. 1, a substrate 100 is provided, on which at least an isolating layer 102, a plurality of word lines 104 and a cap layer 106 are located on the top of the word lines 104, spacers 108 are located on the sidewalls of the word lines 104, a common source region 110 is located between two word lines 104 in the substrate 100, and a drain region 112 is located between the word line 104 and the isolating layer 102 in the substrate 100. Subsequently, the substrate 100 is covered with an insulating layer 115 made of a material such as silicon oxide (SiO). A self-aligned process is carried out to form a self-aligned contact (SAC). A bit line contact opening 116 and a node contact opening 118 are formed in the isolating layer 115 to expose the common source region 110 and the drain region 112. The bit line contact opening 116 and node contact opening 118 have widths slightly larger than the exposed common source region 110 and the drain region 112 for self-alignment. Then, a conductive material is filled in the bit line contact opening 116 and the node contact opening 118 to form a bit line contact 120 and a node contact 122. The conductive material can be polysilicon, for example.

Figure 1A:
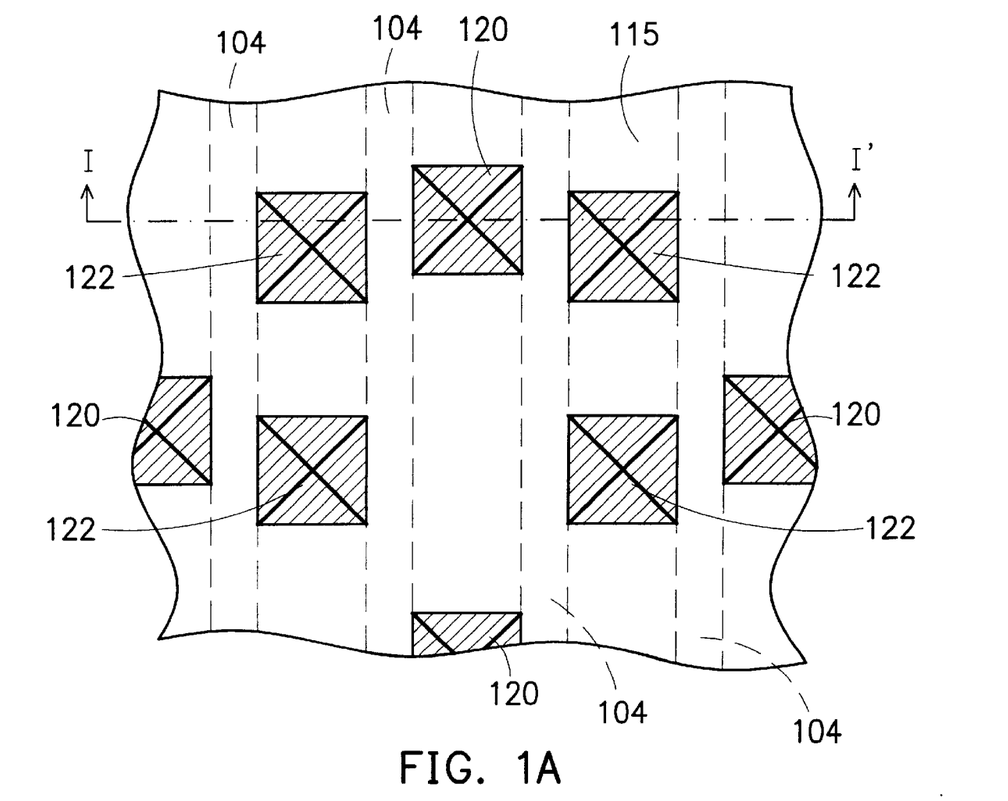
FIGS. 1A, 2A, 4A, 6A and 7A are top views of FIGS. 1, 2, 4, 6 and 7, respectively, in which FIG. 1 (2, 4, 6 or 7) is obtained by cutting along line I–I' (II–II', III–III', IV–IV' or V–V') of FIG. 1A (2A, 4A, 6A or 7A)

Referring to FIG. 1A, a top view of FIG. 1 is shown, in which a cross-sectional view of FIG. 1 is obtained by cutting along line I–I' of FIG. 1A. As shown in FIG. 1A, a word line 104 is located between a bit line contact 120 and node contact 122. A plurality of active regions (not shown in Figure) are located on the rows of the bit line contact 120 and the node contact 122, respectively.

Figure 2:
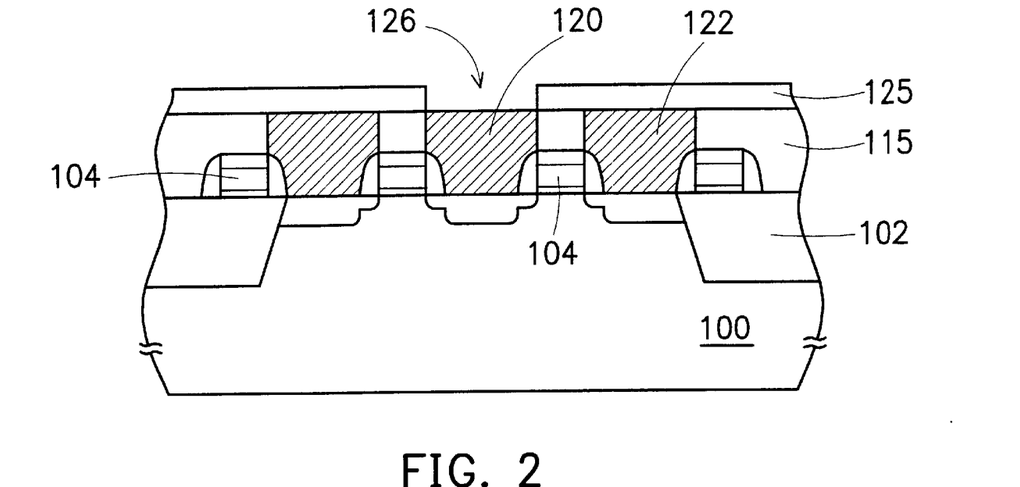

Referring to FIG. 2, a patterned insulating layer 125, made of silicon oxide, for example, is formed on the substrate 100. An opening 126 is formed in such insulating layer 125 to expose the bit line contact 120.

Figure 2A:
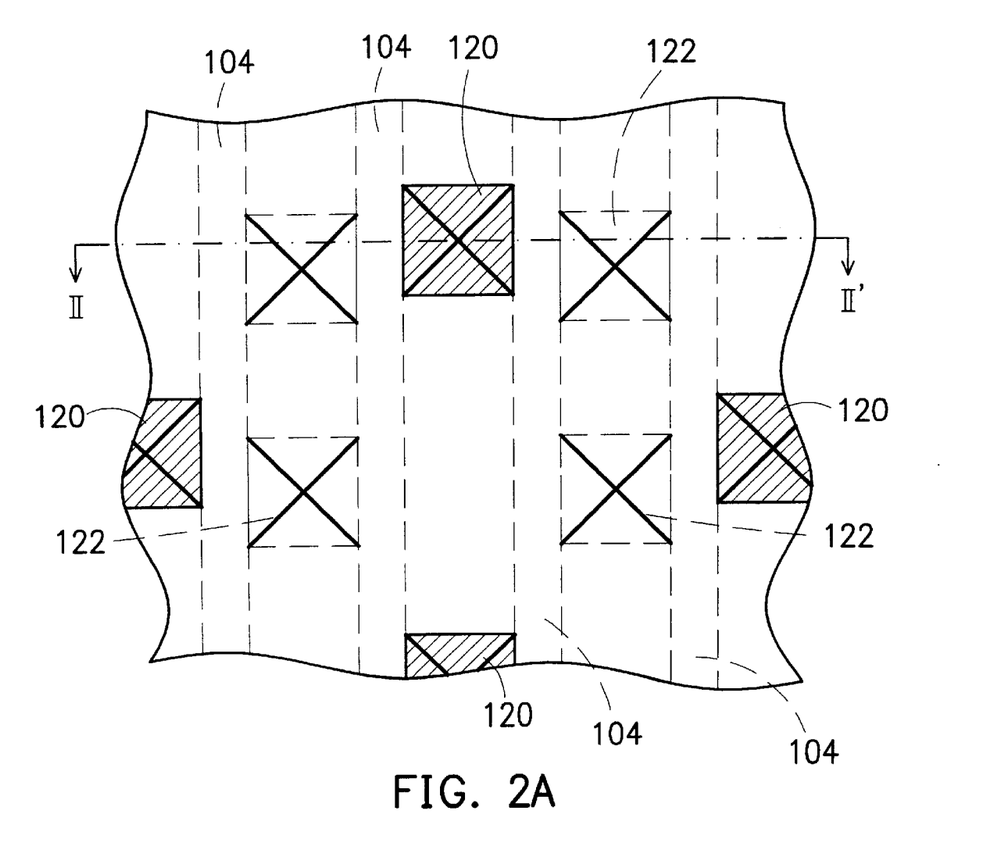

Referring to FIG. 2A, a top view of FIG. 2 is shown, in which FIG. 2 is obtained by cutting along line II–II' of FIG. 2A. In FIG. 2A, the bit line contact 120 is exposed and the node contact 122 is covered.

Figure 3:
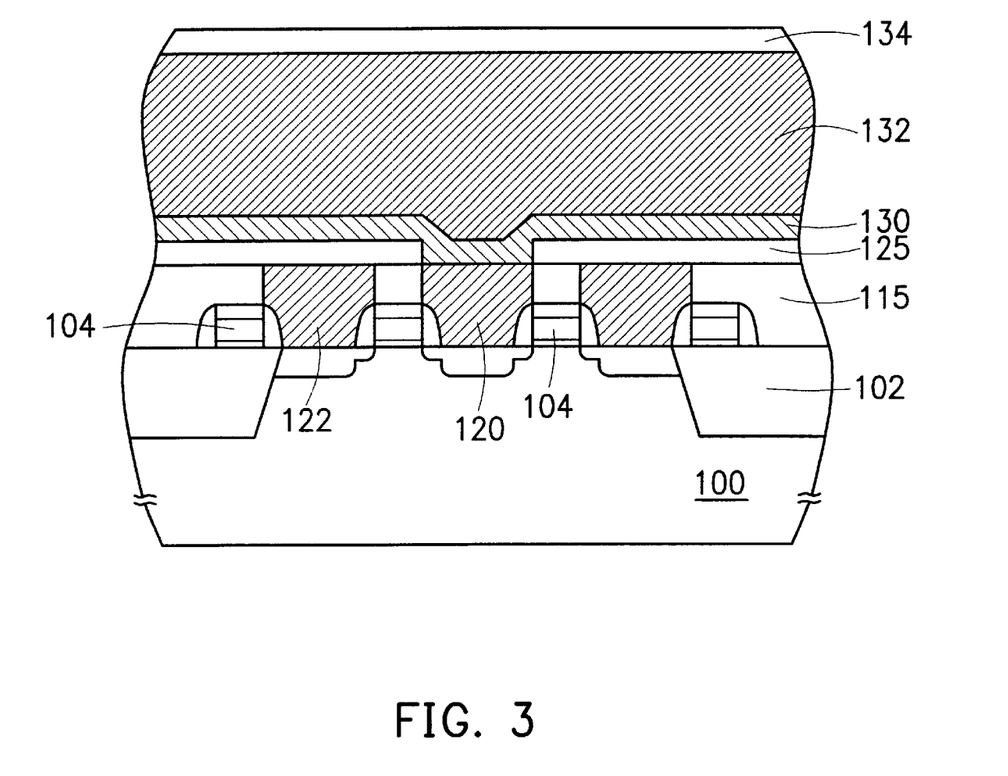

Referring to FIG. 3, a polysilicon layer 130, a metal silicide layer 132 and an insulating layer 134 are formed in sequence on the substrate 100, so that the polysilicon layer 130 is electrically connected to the bit line contact 120. The metal silicide layer 132 can be a tungsten silicide layer, for example. The material for the insulating layer 134 includes silicon oxide. The thickness of the metal silicide layer 132 can be increased greatly, if desired, to increase the surface area of the capacitor bottom electrode to be formed.

Figure 4:
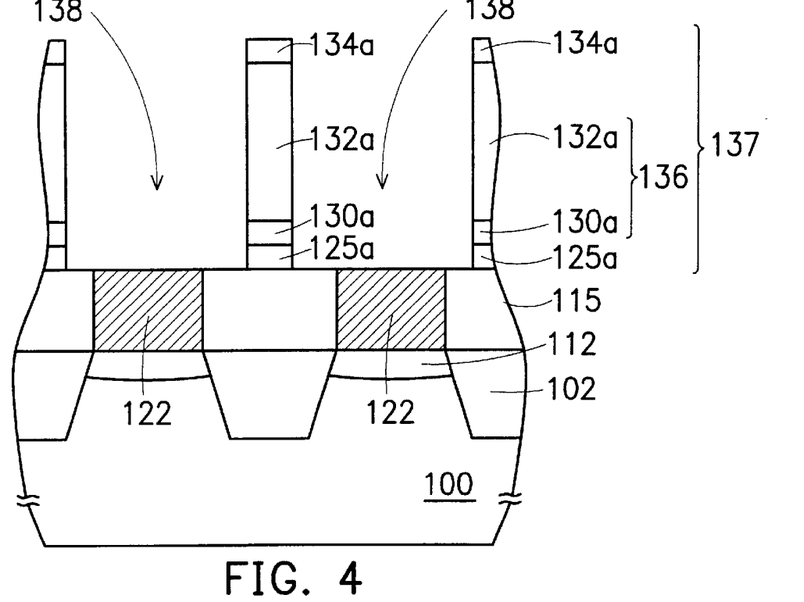
Figure 4A:
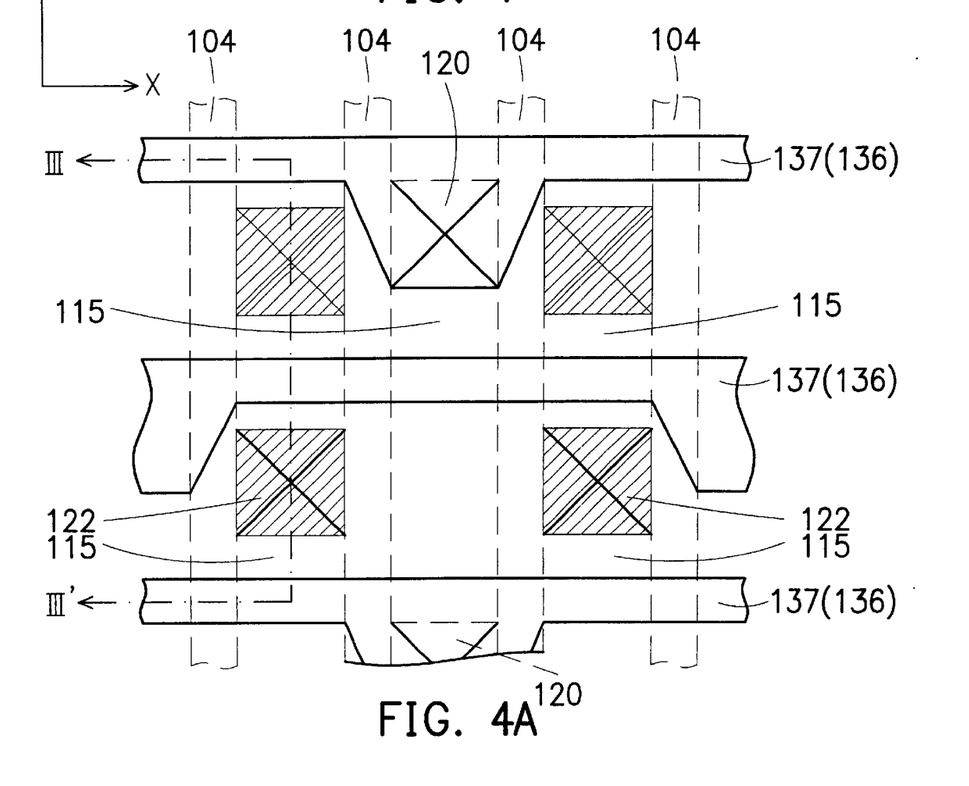

FIG. 4 is another cross-sectional view of the substrate 100 after performing the following steps. FIG. 4A is a top view of FIG. 4, in which FIG. 4 is obtained by cutting along line III–III' of FIG. 4A. From comparison with FIG. 2A, it is clear that the cross section of FIG. 4 is orthogonal to that of FIGS. 2 and 3. In FIGS. 4 and 4A, a patterned insulating layer 134, a metal silicide layer 132, a polysilicon layer 130 and an insulating layer 125 are formed in sequence to form a bit line stacked structure 137 and a bit line 136, which is electrically connected to the bit line contact 120, and to expose the node contact 122. The bit line stacked structure 137 is orthogonal to the word line 104. Each layer in the bit line stacked structure 137 is referred to with a new reference number that adds an "a" after the original reference number, i.e. 125 becomes 125a, 130 becomes 130a, 132 becomes 132a and 134 becomes 134a. The bit line 136 consists of a metal silicide layer 132a and a polysilicon layer 130a. A trench 138 is formed between each two bit line stacked structures 137.

Figure 5:
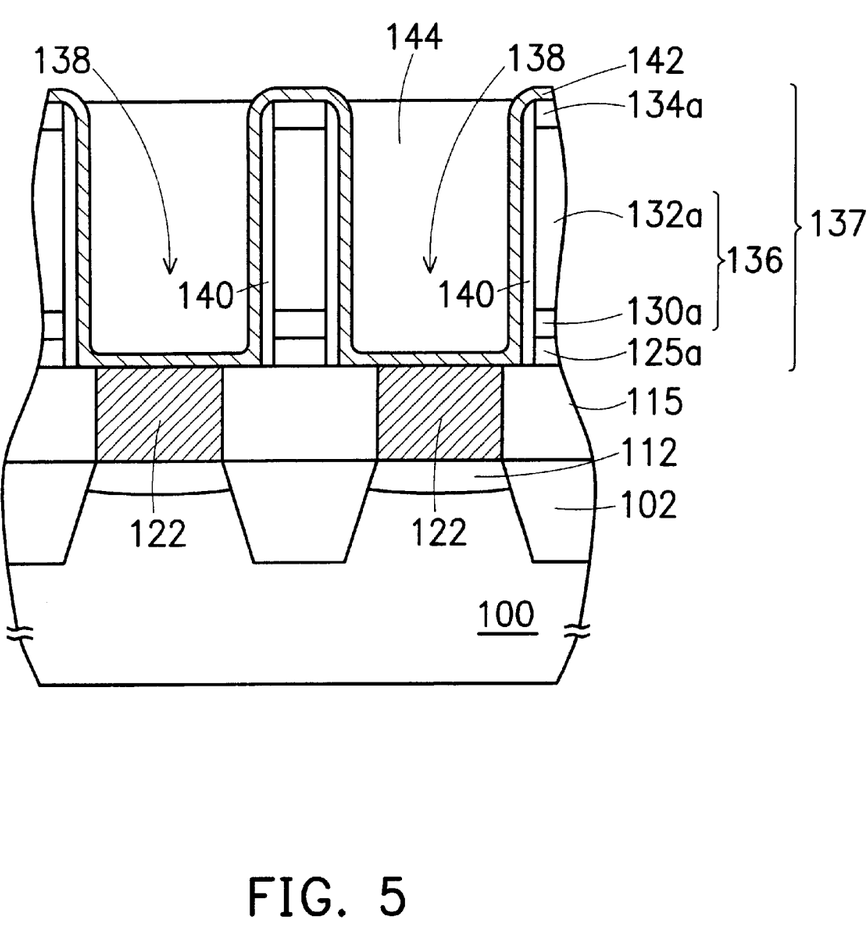

Referring to FIG. 5, spacers 140 are formed on the sidewalls of the bit line stacked structure 137 to electrically isolate the bit line 136. The material for such spacers 140 includes silicon nitride. Then, a conductive layer 142, made of a material such as amorphous silicon, is conformally formed on the substrate 100. A photoresist layer 144 is formed in the trench 138 to protect the bottom of the trench 138 and the sidewalls of the conductive layer 142.

Figure 6:
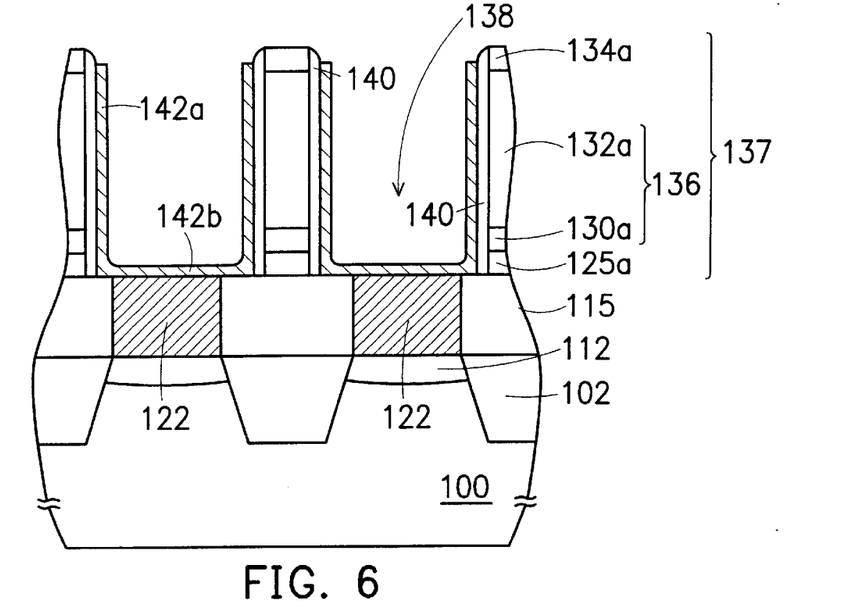

Referring to FIGS. 5 and 6, an etch-back process using the photoresist layer 144 as an etching mask is carried out to remove the conductive layer 142 outside the trench 138. Alternatively, chemical mechanical polishing (CMP) using the insulating layer 134a as a polishing stop is used. Subsequently, the photoresist layer 144 is removed. Further, the conductive layer 142 as shown in FIG. 6 is divided into a crown conductive layer 142a and a bottom conductive layer 142b.

Figure 6A:
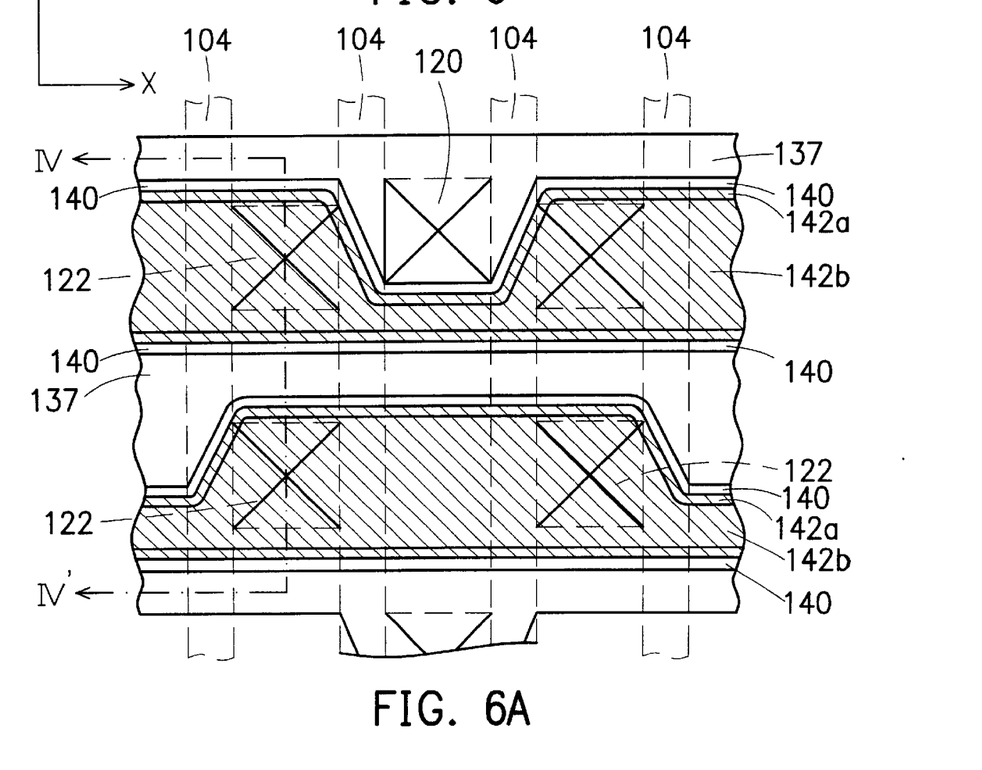

FIG. 6A is a top view of FIG. 6, in which FIG. 6 is obtained by cutting along line IV–IV' of FIG. 6A. As shown in FIG. 6A, the crown/bottom conductive layers 142a/b are in the form of a continuous strip and between the opposite spacers 140.

Figure 7:
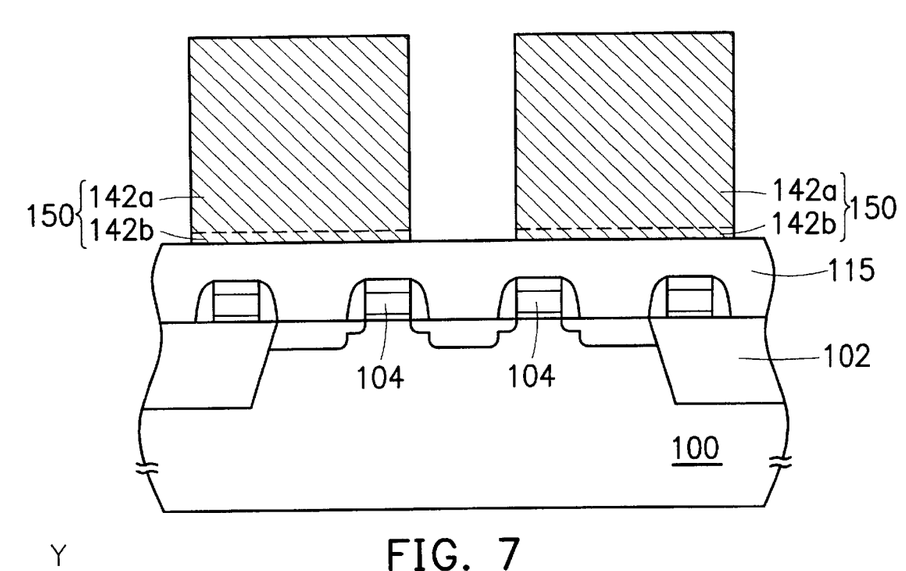
Figure 7A:
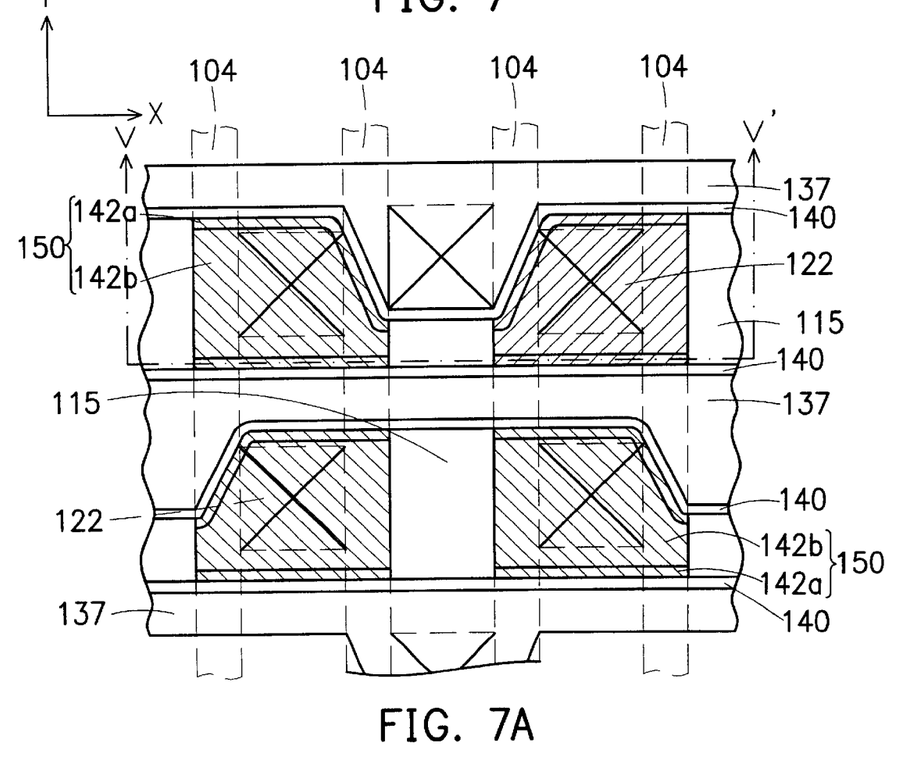
Figure 7B:
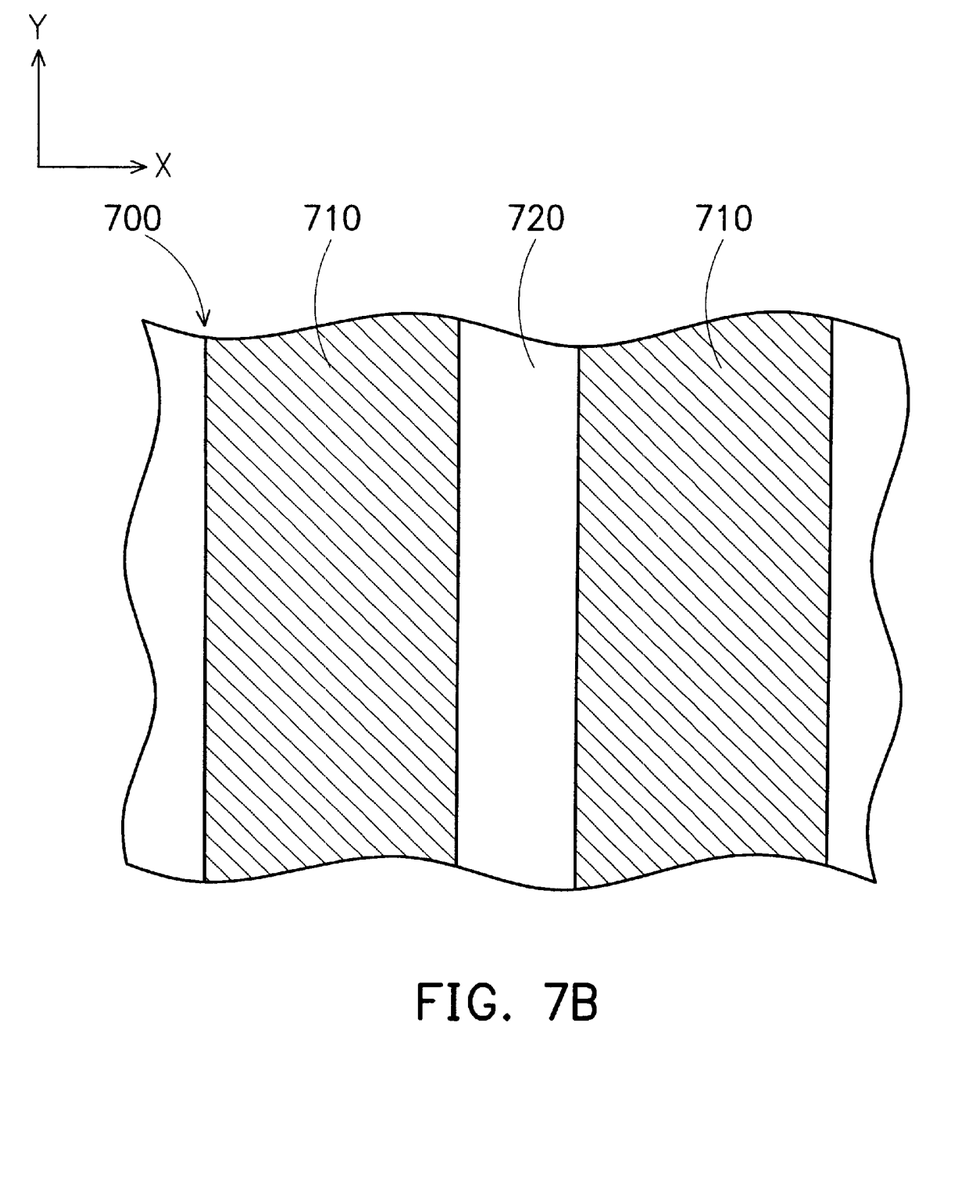
FIG. 7B shows the pattern of photomask used for defining the bottom electrode according to a preferred example of the present invention.

FIG. 7 is a top view of FIG. 7A, in which FIG. 7 is obtained by cutting along line V–V' of FIG. 6A. In FIG. 7A, the crown/bottom conductive layers 142a/b are patterned to form a bottom electrode 150 for a capacitor in electric contact with the node contact 122. It should be understood that the crown/bottom conductive layers 142a, b have been formed in strips; i.e., conductive layers 142a, b have been separated in the Y direction as shown in FIG. 7A (or 6A). As shown in FIG. 7B, a photomask 700 formed in a strip which is separated in the X direction can be used in patterning. When the positive photomask 700 is used in patterning, the photomask includes a non-transparent part 710 extending in the Y direction and a transparent part 720, in which the non-transparent part 710 corresponds to the bottom electrode 150 so that the crown/bottom conductive layers 142a, b are separated in the X direction.

Figure 8:
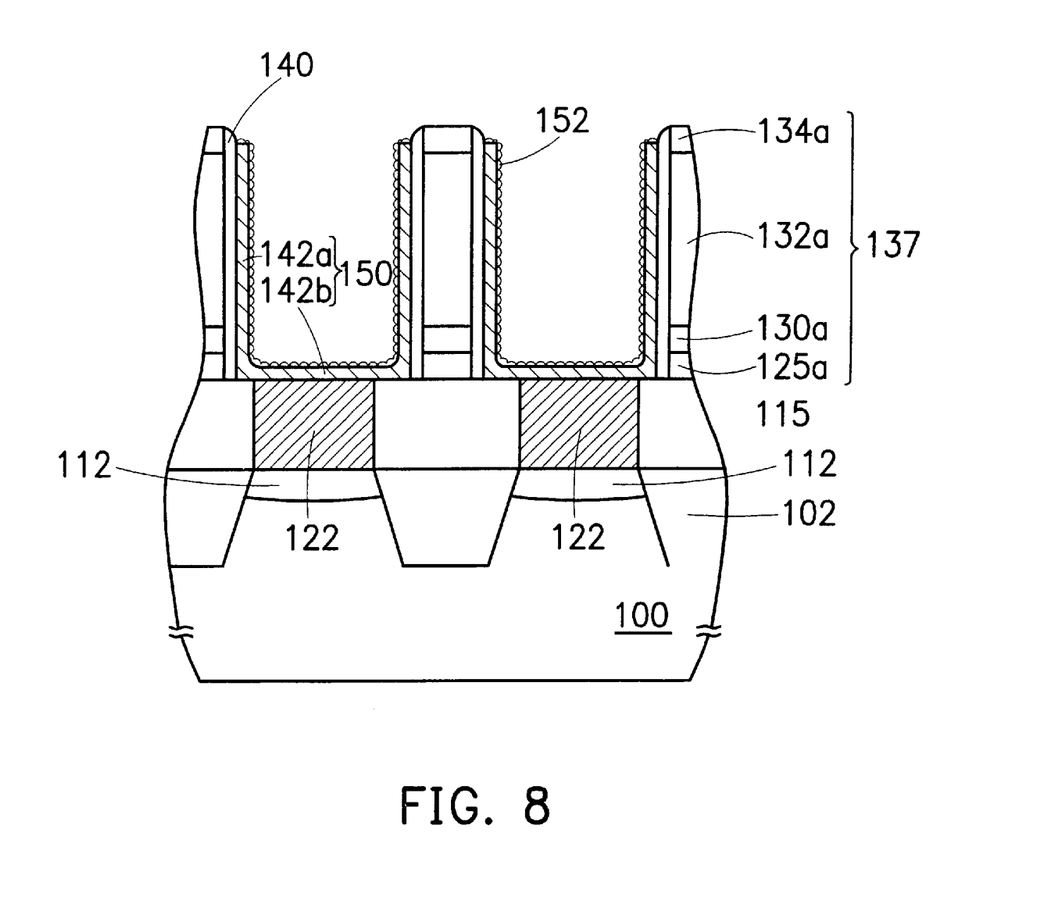

Referring to FIG. 8, another cross-sectional view of the substrate 100 from the other side is shown. The cross section shown in FIG. 8 is orthogonal to the cross section shown in FIG. 7, but is the same as the cross section in FIG. 6. As shown in FIG. 8, hemispherical grained silicon 152 is formed on the bottom electrode 150 to further increase the surface area of the bottom electrode 150.

From the above example of the present invention, the following advantages are included. First, referring to FIG. 1, the bit line contact opening 116 and the node contact opening 118 are formed simultaneously and can be formed by a self-aligned contact process to increase the alignment margin.

Second, the formation of the node contact 122 and the bit line contact 120 is carried out previously (FIG. 1). The polysilicon layer 130 and the metal silicide layer 132 are formed on the insulating layer 125 (FIG. 3) and subsequently patterned (FIGS. 4 and 4A). Therefore, no short circuit occurs between the node contact 122 and the bit line 136. Furthermore, referring to FIGS. 6 and 7A, since the insulating layer 134a and the spacers 140 are provided on the bit line 136 and sides thereof as electric insulating layers, respectively, a short circuit does not occur between the bit line 136 and the bottom electrode 150.

Third, the node contact 122 is exposed when the bit line stacked structure 137 (bit line 136) is defined, and the trench 138 is formed as a patterning board for the bottom electrode 150 (FIGS. 4 and 4A). Therefore, in the Y direction of FIG. 7A, self alignment of the bottom electrode 150 and the node contact 122 is carried out to overcome the problems in the art with respect to alignment of the bottom electrode and the node contact.

Fourth, referring to FIG. 6A, the crown/bottom conductive layers 142a, b are separated in the Y direction. The pattern of the photomask for defining the bottom electrode 150 can be a strip split in the X direction (FIG. 7A) to make production of the photomask much easier.

Fifth, referring to FIGS. 3–6, since the node contact 122 has been formed, the thickness of the metal silicide layer 132a can be increased as desired, without consideration for the etching aspect ratio of the node contact opening in the prior art. Therefore, the cross-sectional area of the bit line 136 is increased (FIGS. 4–6) to reduce the resistance of the bit line 136. Meanwhile, the heights of the crown conductive layer 142b of the bottom electrode 150 are increased (FIG. 7), thereby increasing the surface area of the bottom electrode 150.

In addition, referring to FIG. 5, in a preferred example of the present invention, the conductive layer 142 can be a polysilicon layer having a hemispherical grained silicon layer thereon. The bottom electrode 150 having a hemispherical grained silicon layer is formed directly after the crown/bottom conductive layers 142a, b are defined without forming the hemispherical grained silicon 152 as shown in FIG. 8.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A structure of a DRAM, suitable for formation on a substrate, comprising:
    a plurality of word lines located on the substrate;
    a plurality of source/drain regions disposed on sides of each of the word lines;
    a first insulating layer located on the word line, the source/drain region and the substrate;
    a plurality of bit line contacts and a plurality of node contacts, in which the bit line contacts and the node contacts are located in the first insulating layer and are in electric contact with the source/drain regions;
    a plurality of bit line stacked structures located on the bit line contacts and the first insulating layer, in which the bit line stacked structures are orthogonal to the word lines, and each of the bit line stacked structures is built up by stacking a second insulating layer, a bit line and a third insulating layer from bottom to top, with the bit line passing through the second insulating layer and electrically connecting to the bit line contacts;
    a plurality of spacers located on sidewalls of the bit line stacked structures and forming a plurality of trenches; and
    a plurality of bottom electrodes located on surfaces of the trenches between the spacers, each bottom electrode being electrically connected to one of the node contacts.

2. The structure of claim 1, wherein the first conductive layer comprises a polysilicon layer and a metal silicide layer thereon.

3. The structure of claim 1, wherein the bottom electrode is made of polysilicon, and a hemispherical grained silicon layer is formed on a surface of each of the bottom electrodes.

4. The structure of claim 1, wherein the bottom electrode is made of amorphous silicon, and a hemispherical grained silicon layer is formed on a surface of each of the bottom electrodes.

5. The structure of claim 1, wherein the first insulating layer is made of silicon oxide.

6. The structure of claim 1, wherein the second insulating layer is made of silicon oxide.

7. The structure of claim 1, wherein the third insulating layer is made of silicon oxide.

8. The structure of claim 1, wherein the spacers is made of silicon nitride.

* * * * *